(12) United States Patent
Lee et al.

(10) Patent No.: US 6,984,530 B2
(45) Date of Patent: Jan. 10, 2006

(54) METHOD OF FABRICATING A MRAM DEVICE

(75) Inventors: Heon Lee, Seoul (KR); Thomas C. Anthony, Sunnyvale, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 19 days.

(21) Appl. No.: 10/811,553

(22) Filed: Mar. 29, 2004

(65) Prior Publication Data

US 2005/0214953 A1    Sep. 29, 2005

(51) Int. Cl.
*H01L 21/00* (2006.01)
(52) U.S. Cl. .......................... 438/3; 438/253; 438/254; 438/257; 438/593
(58) Field of Classification Search ................... 438/3, 438/254–258
See application file for complete search history.

(56) References Cited

U.S. PATENT DOCUMENTS 6,780,652 B2 *   8/2004   Lee ............................... 438/3

* cited by examiner

*Primary Examiner*—Dung A. Le

(57) ABSTRACT

A method of fabricating a magnetic random access memory (MRAM) device is disclosed. The method reduces the number of mask steps and processing steps required to fabricate the MRAM device. A first conductive layer and a sense layer are patterned in a first mask step. A subsequent etching step forms a bottom electrode and a sense layer that are continuous with each other in a first direction. A second conductive layer and a plurality of layers of material required to form a magnetic tunnel junction stack are patterned in a second mask step. A subsequent etching step forms a top electrode and a plurality of layers of material that are continuous with each other in a second direction, and a plurality of discrete sense layers. The discrete sense layers and the plurality of layers of material define a plurality of magnetic tunnel junction devices.

14 Claims, 15 Drawing Sheets

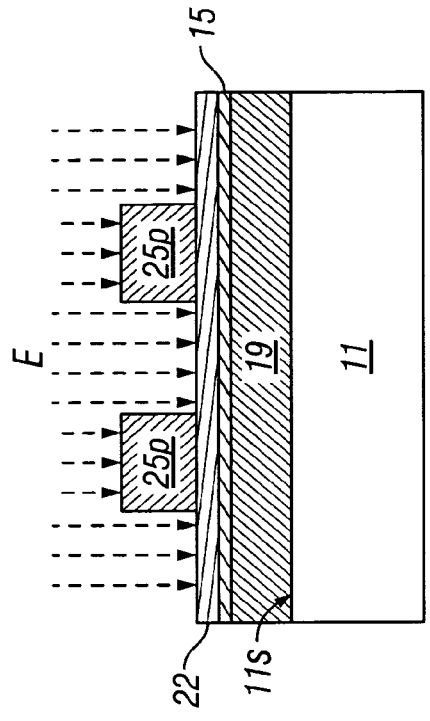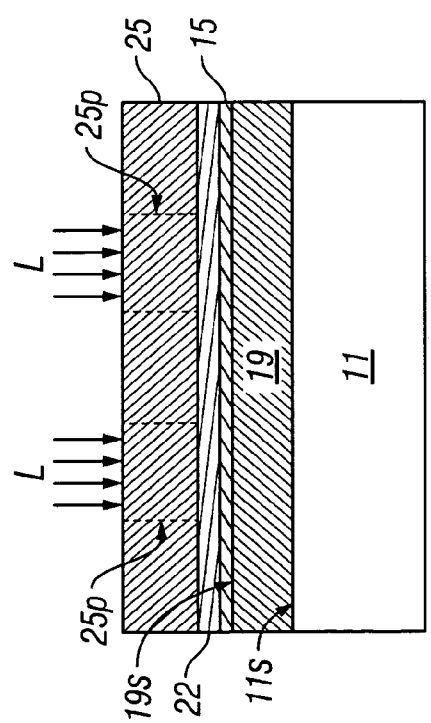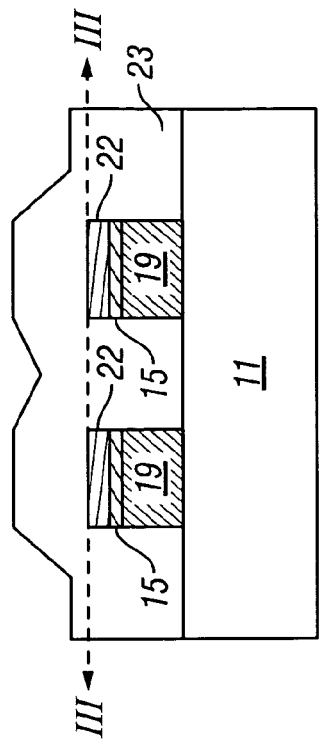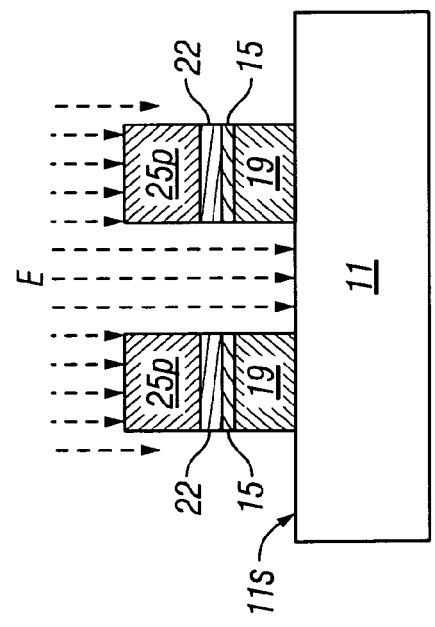
FIG. 8a
FIG. 8b
FIG. 8c
FIG. 8d

METHOD OF FABRICATING A MRAM DEVICE

FIELD OF THE INVENTION

The present invention relates generally to a method of fabricating a magnetic random access memory device (MRAM). More specifically, the present invention relates to a method of fabricating a MRAM device with a reduced number of mask steps and a reduced number of processing steps.

BACKGROUND OF THE ART

Magnetic Random Access Memory (MRAM) is an emerging technology that can provide an alternative to traditional data storage technologies. MRAM has desirable properties including fast access times like DRAM and non-volatile data retention like hard disc drives. MRAM stores a bit of data (i.e. information) as an alterable orientation of magnetization in a patterned thin film magnetic element that is referred to as a data layer, a sense layer, a storage layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exists on the subject of spin tunneling.

In a tunneling magnetoresistance (TMR) MRAM device, a thin barrier layer made from a dielectric material (e.g. aluminum oxide $Al_2O_3$) separates the data layer from a reference layer (also referred to as a pinned layer). On the other hand, in a giant magnetoresistance (GMR) MRAM device, a thin barrier layer of an electrically conductive material (e.g. copper Cu) separates the data layer from the reference layer.

The reference layer has a pinned orientation of magnetization (see m1 and 201 in FIG. 3b), that is, the pinned orientation of magnetization m1 is fixed in a predetermined direction and does not rotate in response to an external magnetic field. In contrast the data layer has an alterable orientation of magnetization (see m2 and 205 in FIG. 3b) that can rotate between two orientations in response to an external magnetic field.

As an example, when the pinned orientation of magnetization m1 and the alterable orientation of magnetization m2 point in the same direction (i.e. they are parallel to each other) the data layer 205 stores a binary one ("1"). On the other hand, when the pinned orientation of magnetization m1 and the alterable orientation of magnetization m2 point in opposite directions (i.e. they are anti-parallel to each other) the data layer 205 stores a binary zero ("0").

In FIG. 1, a prior method of fabricating a MRAM device includes a plurality of process steps including at least three mask steps denoted in dashed line as prior stages 405, 417, and 427. A mask step can include photolithography processes that are well understood in the microelectronics fabrication art, for example: depositing a layer of a photoresist material on a previously formed layer; using a photolithography process to expose the photoresist material through a photo mask to form a pattern in the photoresist material; and developing the photoresist material to render the pattern.

In FIG. 2a and referring to FIG. 1, at a prior stage 403 a first conductive layer 219 (e.g. tungsten W or aluminum Al) is deposited on a substrate 211 (e.g. silicon Si). In FIG. 2b, at a prior stage 405, the first conductive layer 219 is patterned by depositing a mask layer 225 on the first conductive layer 219. The mask layer 225 can subsequently be exposed with a light L through a photo mask (not shown) to form a pattern 225p (see dashed lines) in the mask layer 225, followed by developing the mask layer 225 to form an etch mask 225 (see FIG. 2c).

In FIG. 2c, at a prior stage 407, the first conductive layer 219 is etched e through the etch mask 225 to form a bottom electrode 219. In FIG. 2d, at a prior stage 409, a dielectric layer 223 is deposited over the bottom electrode 219. In FIGS. 2d and 2e, at a prior stage 411, the dielectric layer 223 is planarized along a line I—I to form a substantially planar surface 223s. After the planarization, a surface 219s of the bottom electrode 219 is exposed and is substantially flush with the substantially planar surface 223s. A process such as chemical mechanical planarization (CMP) can be used to planarize the dielectric layer 223.

In FIG. 3a, at a prior stage 413, a plurality of layers of material that are collectively denoted as 230 are deposited on the substantially planar surfaces (see 223s and 219s in FIG. 2e). Because the surface 219s of the bottom electrode 219 is exposed, a bottom most of the plurality of layers of material 230 is in contact with the bottom electrode 219. The plurality of layers of material 230 can be deposited in a process order that is determined by a topology of a specific type of MRAM device. Typically, either the data layer 205 or the reference layer 201 is in contact with the bottom electrode 219. In FIG. 3b, a section II of FIG. 3a depicts in greater detail the plurality of layers of material 230. For example, a data layer 205 that includes an alterable orientation of magnetization m2 can be deposited on the substantially planar surface 223s with the data layer 205 in contact with the bottom electrode 219, followed by a tunnel barrier layer 203 and a reference layer 201 that includes a pinned orientation of magnetization m1, and finally an optional layer, such as a cap layer 202. For example the cap layer 202 can be made from tantalum (Ta).

In FIG. 4a, at a prior stage 415, a dual-layer resist (247, 245) is deposited on the plurality of layers of material 230 (i.e. on an upper most layer of 230). The dual-layer resist includes a layer of photoresist material 247 that is deposited first, followed by another layer of photoresist material 245 that is deposited last. The layers 247 and 245 have differing lateral etch rates when exposed to an etch material as will be described below. At a prior stage 417, the dual-layer resist (247, 245) is patterned by exposure to a light L to form a pattern 248p (see dashed lines) in the dual-layer resist (247, 245).

In FIGS. 4b and 5a, at a prior stage 419, the dual-layer resist (247, 245) and the plurality of layers of material 230 are etched e all the way through to the substantially planar surface 223s. Consequently, the etching e forms a discrete magnetic tunnel junction stack 230 from a previously continuous plurality of layers of material 230 as depicted in FIG. 4a. The discrete magnetic tunnel junction stacks 230 are positioned over the bottom electrodes 219 and the etching e forms a reentrant profile 260 in the dual-layer resist (247, 245) that includes an undercut portion U in the layer 247 that is inset from the layer 245. The reentrant profile 260 is created due to a material for the layer 247 having a faster etch rate than a material for the layer 245 when exposed to the etch material used for the etching e. Consequently, the layer 247 etches at a faster rate than the layer 245 and the under cut portion U is formed. The reentrant profile 260 creates a mushroom-like structure with the layer 245 being analogous to a cap of the mushroom and the layer 247 being analogous to a stem of the mushroom. A portion of the discrete magnetic tunnel junction stacks 230 is covered by the layer 247.

In FIG. 5a, at a prior stage 421, a dielectric material 251 (e.g. aluminum oxide $Al_2O_3$) is deposited over the reentrant profile 260 and covers a portion of the substantially planar surface 223s and a portion of the discrete magnetic tunnel junction stacks 230 that are not covered by the layer 247. In FIG. 5b, at a prior stage 423, the reentrant profile 260 is lifted-off of the discrete magnetic tunnel junction stacks 230 and a via 261 is formed over the discrete magnetic tunnel junction stacks 230. Typically, a solvent such as acetone or a photoresist removal solvent can be used to lift-off the reentrant profile 260.

In FIG. 6a, at a prior stage 425 a second conductive layer 217 is deposited over the dielectric layer 251 and in the via 261. Subsequently, in FIGS. 6a and 6b, at a prior stage 427, the second conductive layer 217 is patterned with a mask layer 249, and then at a prior stage 429, the second conductive layer 217 is etched e to form a top electrode 217.

In FIG. 6b, an MRAM array 300 includes a plurality of the discrete magnetic tunnel junction stacks 230 (see dashed outlines) positioned intermediate between an intersection of the top electrode 217 and the bottom electrode 219. The top electrode 217 and the bottom electrode 219 can be row and column conductors respectively of the MRAM array 300.

One disadvantage of the prior method of fabricating a MRAM device as described above in reference to FIG. 1, is that at least three mask steps (i.e. the patterning at prior stages 405, 417, and 427) are required. Moreover, each of those mask steps is followed by an etching step (i.e. prior stages 407, 419, and 427). Consequently, a total of at least six processing steps are required (e.g. at least three mask steps and at least three etching steps). In the microelectronics art it is well understood that reducing the number of process steps can result in an increase in device yield and a reduction in a cost of manufacturing a device. Each process step increases manufacturing costs and creates the potential for a defect and/or contamination that can result in a decrease in yield. Because a feature size of commercially viable MRAM devices is typically less than 100 nm, process and contamination defects can negatively affect device yield. Accordingly, it is very desirable to reduce the number of process steps so that yield is increased.

A second disadvantage of the prior method of fabricating a MRAM device as described above in reference to FIG. 1, is that the dual-layer resist methodology requires additional processing steps including the depositing of both layers (247, 245) of the photoresist at the prior stage 415, depositing the dielectric material 251 at the prior stage 421, and lifting-off the reentrant profile 260 at the prior stage 423. Each of those processing steps can result in a defect that will reduce yield and increases a cost of manufacturing the prior MRAM device.

A third disadvantage of the prior method of fabricating a MRAM device as described above in reference to FIG. 1, is that separate deposition, mask, and etching steps (e.g. 413, 415, 417 & 419 and 421 through 429) are required to form the discrete magnetic tunnel junction stacks 230 and the top electrode 217. As stated above, it is desirable to reduce the number of process steps so that yield is increased and manufacturing cost is decreased.

Consequently, there exists a need for a method of fabricating an MRAM device that reduces the number of mask steps and processing steps required to fabricate the MRAM device. There is also a need for a method of fabricating an MRAM device that eliminates the additional processing steps required by a dual-layer resist methodology. There is also a need for a method of fabricating an MRAM device that reduces the number of processing steps required to form some or all of the layers of a magnetic tunnel junction stack and a top electrode.

SUMMARY OF THE INVENTION

A method of fabricating a MRAM device according to the present invention solves the aforementioned disadvantages of prior methods for fabricating MRAM devices by reducing the number of mask and processing steps required to fabricate a MRAM device.

The method of fabricating a MRAM device requires only two mask steps instead of the three or more mask steps of prior methods of fabricating a MRAM device. Moreover, the method of fabricating a MRAM device eliminates the additional processing steps required to implement the prior dual-layer resist methodology. Furthermore, a top electrode and a plurality of layers of material that define a magnetic tunnel junction stack are formed in one patterning step and one etching step, thereby reducing the number of processing steps required to form a magnetic tunnel junction device and a top electrode.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 8a is a cross-sectional view depicting a patterning of a stop layer.

FIGS. 8b and 8c are a cross-sectional views depicting an etching of a stop layer.

FIG. 8d is a cross-sectional view depicting a depositing of a dielectric layer.

DETAILED DESCRIPTION

Figure 1:
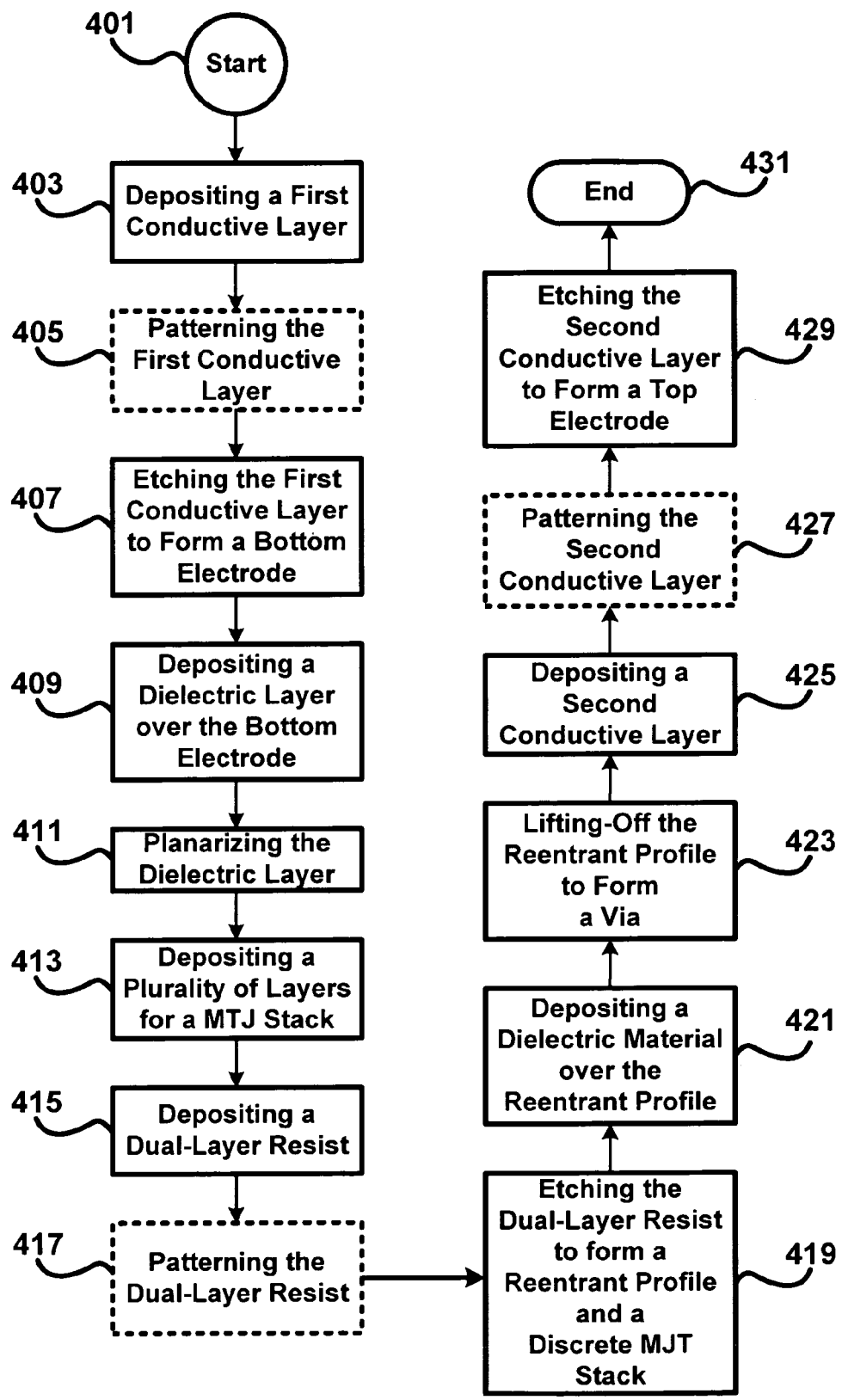
FIG. 1 is a flow diagram depicting a prior method of fabricating a prior MRAM device.
Figure 2A:
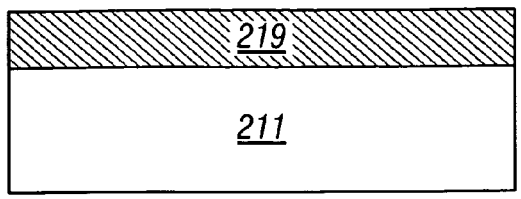
FIGS. 2a through 6b depict prior processing steps for fabricating a prior MRAM device according to the prior method depicted in FIG. 1.
Figure 2B:
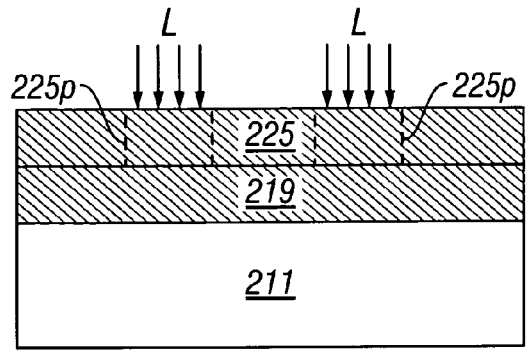
Figure 2C:
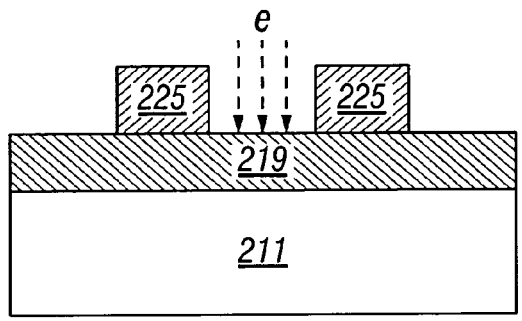
Figure 2D:
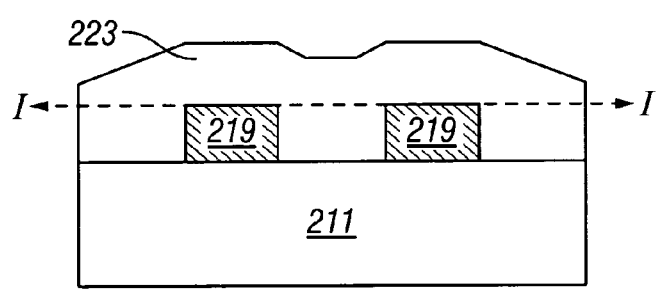
Figure 2E:
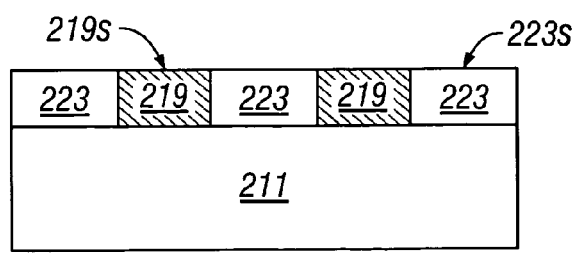
Figure 3A:
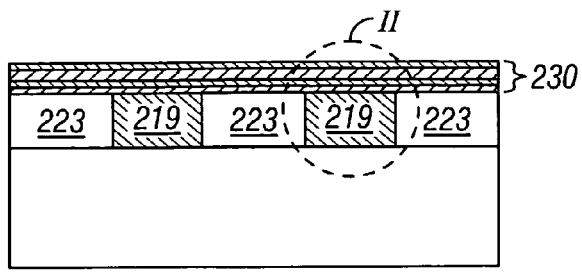
Figure 3B:
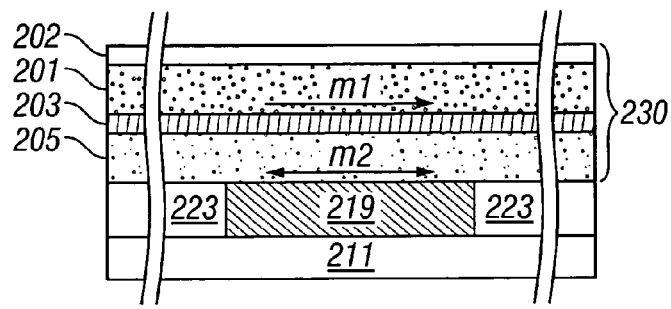
Figure 4A:
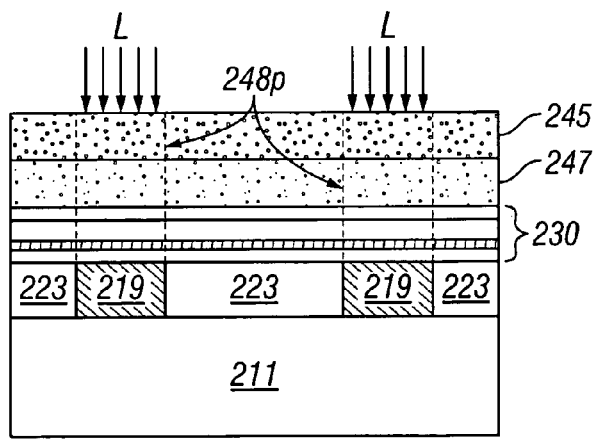
Figure 4B:
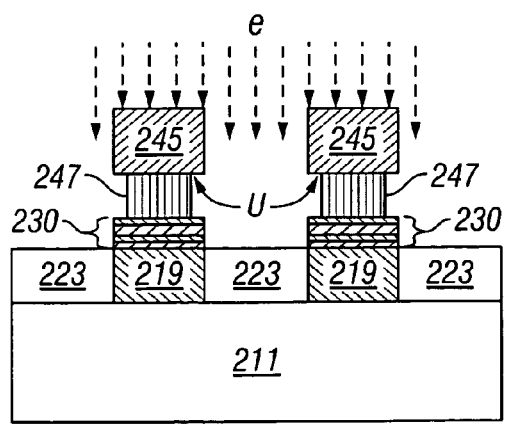
Figure 5A:
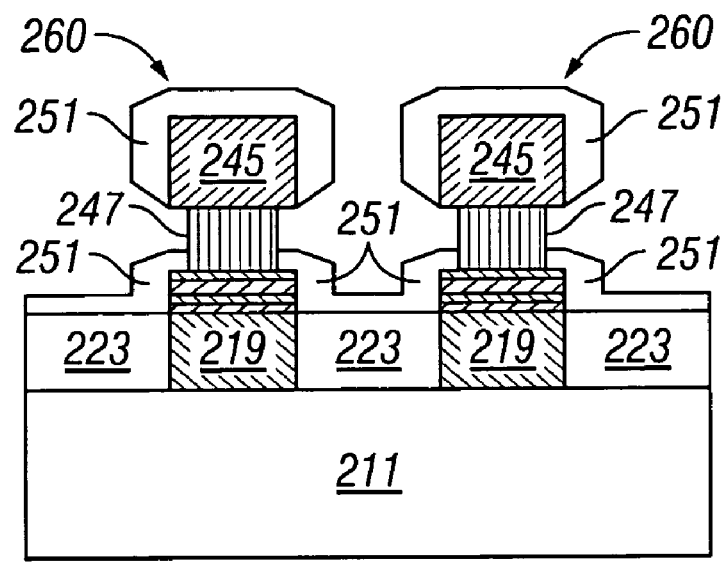
Figure 5B:
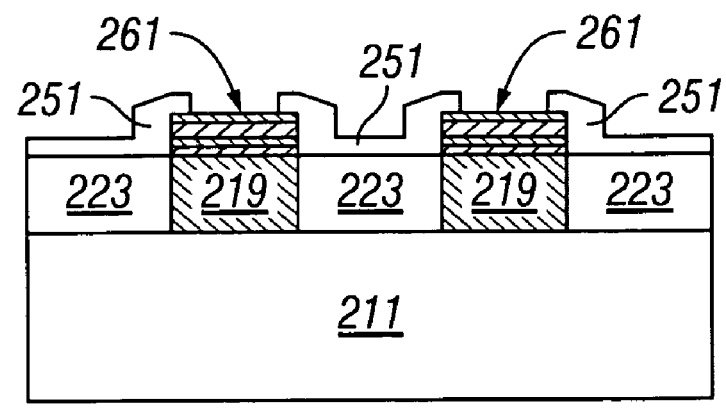
Figure 6A:
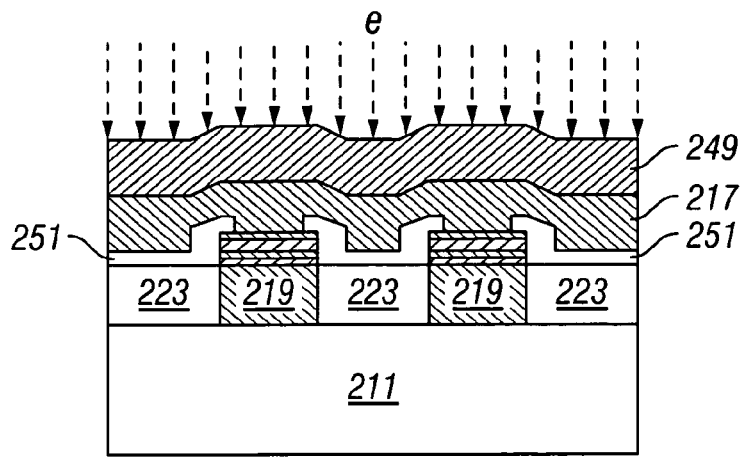
Figure 6B:
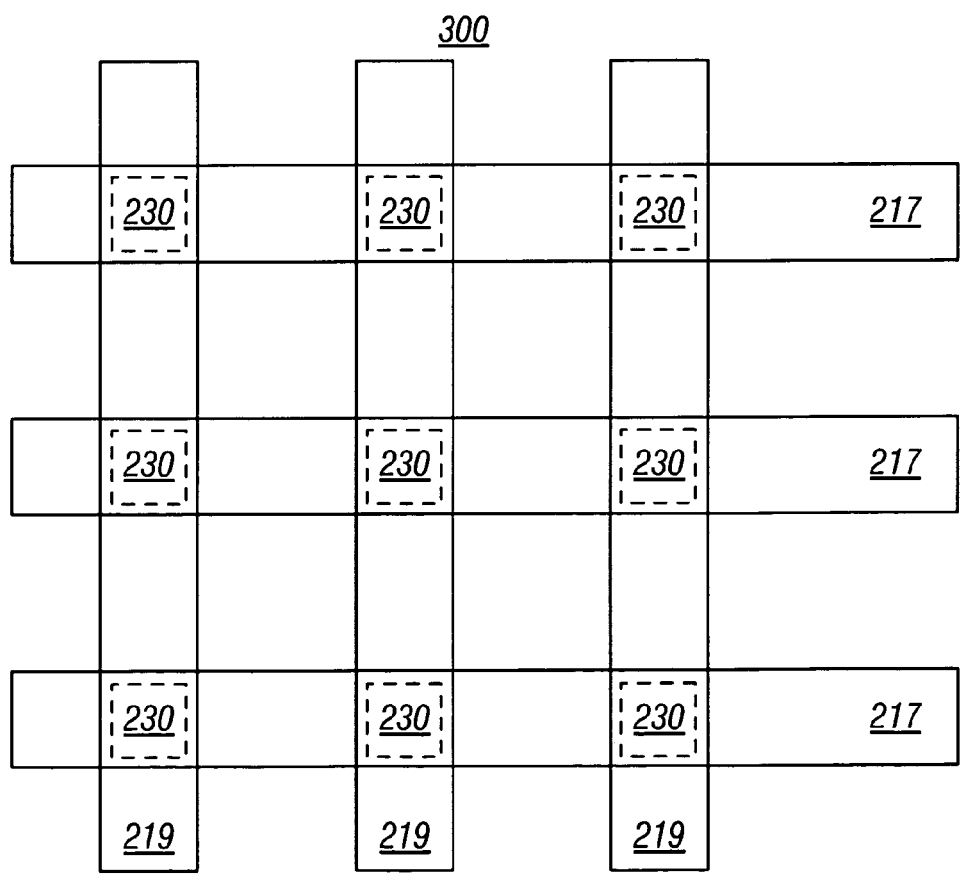

In the following detailed description and in the several figures of the drawings, like elements are identified with like reference numerals.

As shown in the drawings for purpose of illustration, the present invention is embodied in a method of fabricating a magnetic random access memory device (MRAM hereinafter), a MRAM device fabricated according to the method of fabricating a MRAM device, and a MRAM device.

Figure 7:
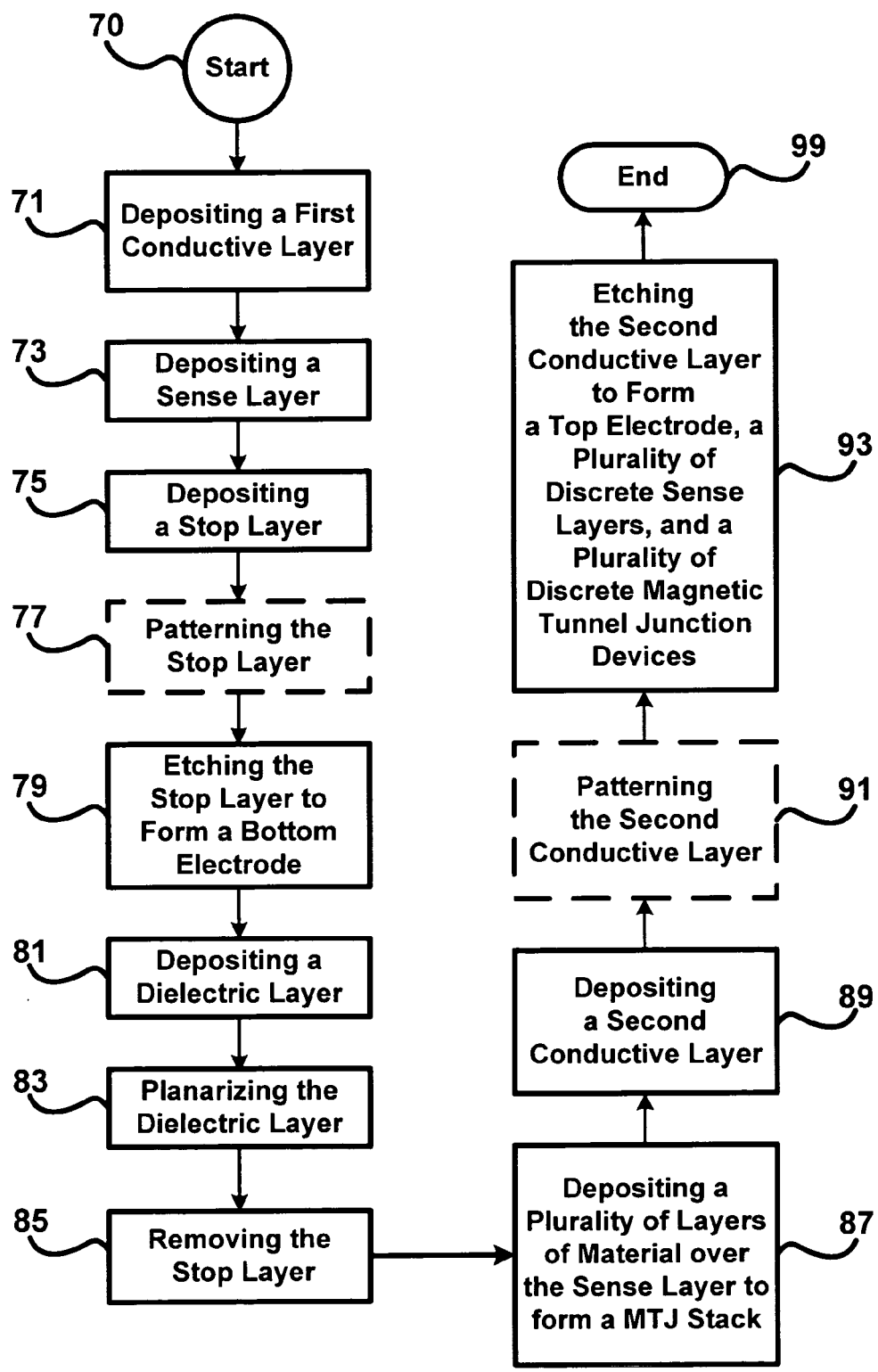
FIGS. 7, 7a, and 7b are flow diagrams depicting a method of fabricating a MRAM device.

In FIG. 8a and referring to a method of fabricating a MRAM device as depicted in FIG. 7, at a stage 71 a first conductive layer 19 is deposited on a substrate 11. The substrate 11 can be a material including but not limited to a semiconductor material or a dielectric material. For example, the substrate 11 can be silicon (Si) or a single crystal silicon wafer such as the type that is commonly used in the microelectronic art. Alternatively, the substrate 11 can be a dielectric material such as a silicon oxide ($SiO_2$), a silicon nitride ($Si_3N_4$), an aluminum oxide ($Al_2O_3$), or a silicate glass, for example. Preferably a surface 11s of the substrate 11 is substantially flat in preparation for a subsequent deposition of a sense layer as will be described below.

The first conductive layer 19 can be deposited or otherwise formed on the surface 11s using processing techniques that are well understood in the microelectronics art. For instance, processes including but not limited to chemical vapor deposition (CVD), physical vapor deposition (PVD), plasma enhanced chemical vapor deposition (PECVD), and sputtering. The first conductive layer 19 can be made from a material including but not limited to a metal, tungsten (W), copper (Cu), and aluminum (Al).

At a stage 73, a sense layer 15 is deposited on the first conductive layer 19. In the magnetic tunnel junction art, the sense layer 15 is also referred to as a data layer, a storage layer, or a data film. The sense layer 15 includes an alterable orientation of magnetization (not shown) that has two stable and distinct magnetic states that define a binary one ("1") and a binary zero ("0") for the storage of a bit of data in the sense layer 15. The sense layer 15 can be made from a variety of ferromagnetic materials that are well understood in the MRAM art.

At a stage 75, a stop layer 22 is deposited on the sense layer 15. The stop layer 22 will serve as a stop layer for a planarization process that will be described below. For example, the stop layer 22 can be a stop layer for a chemical mechanical planarization (CMP) process. Suitable materials for the stop layer 22 include but are not limited to silicon nitride ($Si_3N_4$), for example. As will be described below, the stop layer 22 and the process stages associated with the stop layer 22 can optionally be eliminated.

In FIGS. 8a and 8b, at a stage 77, the stop layer 22 is patterned in a first mask step as denoted by the dashed lines for the stage 77 in FIG. 7. As is well understood in the microelectronics art, the patterning at the stage 77 can include depositing a layer of photoresist material 25, exposing the layer of photoresist material 25 to a light L through a photo mask (not shown) that carries a pattern to be replicated in the layer of photoresist material 25 (see dashed lines 25p), and then developing the layer of photoresist material 25 to form an etch mask 25p that covers a portion of the stop layer 22. The patterning step describe above for the stage 77 is an example only and the stop layer 22 can be patterned using any process that results in an etch mask 25p being formed on the stop layer 22.

In FIGS. 8b and 8c, at a stage 79, the stop layer 22 is etched E to remove those portions of the stop layer 22, the sense layer 15, and the first conductive layer 19 that are not covered by the etch mask 25p. Accordingly, the etching E continues until the layers (22, 15, 19) that are not covered by the etch mask 25p are etched down to the surface 11s of the substrate 11. Preferably, a directional etch process such as a reactive ion etch (RIE) is used for the etching E at the stage 79. Consequently, the etching E forms a bottom electrode 19 and a sense layer 15 that is continuous with the bottom electrode 19 in a first direction (see arrow C in FIG. 8g). The sense layer 15 is continuous (i.e. is unbroken) with the bottom electrode 19 because it spans an entire width and length of the bottom electrode 19 along the first direction C. After the etching E, the etch mask 25p can be removed by a solvent or an ashing process, for example.

Figure 8E:
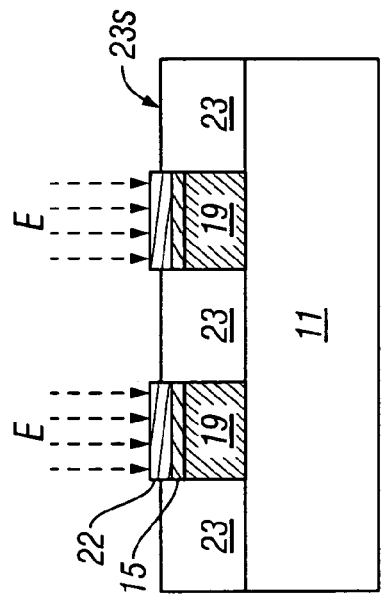
FIG. 8e is a cross-sectional view depicting an etching of a stop layer.

In FIG. 8d, at a stage 81, a dielectric layer 23 is deposited and the dielectric layer 23 completely covers the bottom electrode 19, the sense layer 15, and the stop layer 22. The dielectric layer 23 can be made from a material including but not limited to a silicon oxide ($SiO_2$), a silicon nitride ($Si_3N_4$), a tetraethylorthosilicate (TEOS), or a doped tetraethylorthosilicate. Examples of a doped TEOS include but are not limited to a boron (B) doped TEOS (BSG), a phosphorus (P) doped TEOS (PSG), and a boron (B) and phosphorus (P) doped TEOS (BPSG). At a stage 83, the dielectric layer 23 is planarized to form a substantially planar surface 23s (see FIG. 8e) on the dielectric layer 23. For example, a process such as CMP can be used to planarize the dielectric layer 23 along a line III—III to form the substantially planar surface 23s.

In FIG. 8e, after the planarization at the stage 83, the dielectric layer 23 includes the substantially planar surface 23s. Depending on a selectivity of the CMP slurry to the material of the dielectric layer 23, the stop layer 22 may extend outward of the substantially planar surface 23s. Although not depicted in FIG. 8e, the substantially planar surface 23s and the stop layer 22 can also be substantially flush with each other.

Figure 8F:
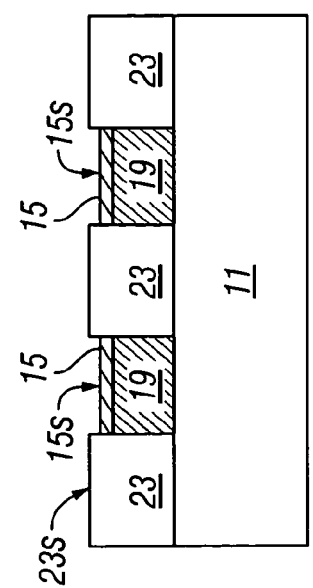
FIGS. 8f and 8g are a cross-sectional view and a profile view respectively of a sense layer formed on a bottom electrode.
Figure 8G:
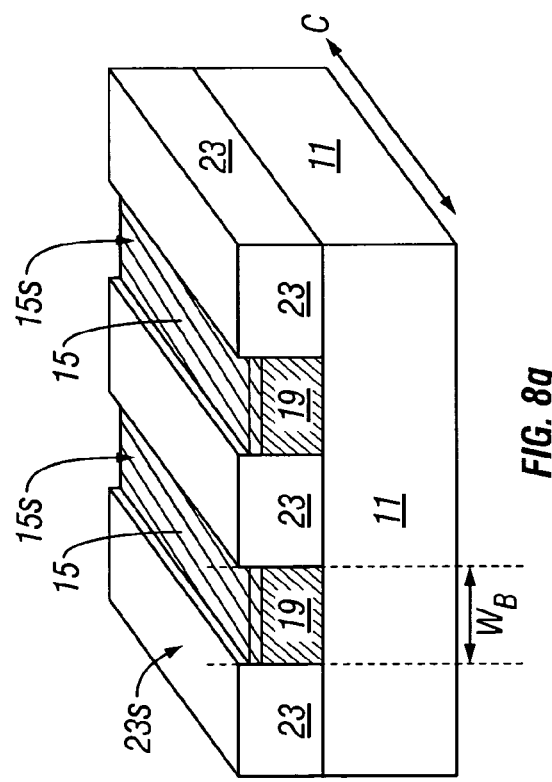

In FIGS. 8e through 8g, at a stage 85, the stop layer 22 is removed to expose a surface 15s of the sense layer 15. The surface 15s is exposed in preparation for a subsequent deposition process as will be described below. For example, removing the stop layer 22 can be accomplished using an anisotropic etch process, such as a reactive ion etching process (RIE), to etch E the stop layer 22. In FIG. 8g, after the removing of the stop layer 22 at the stage 85, the bottom electrode 19 and the sense layer 15 have a width $W_B$. Moreover, the sense layer 15 is continuous with the bottom electrode 19 in the first direction C as was described above.

Figure 9A:
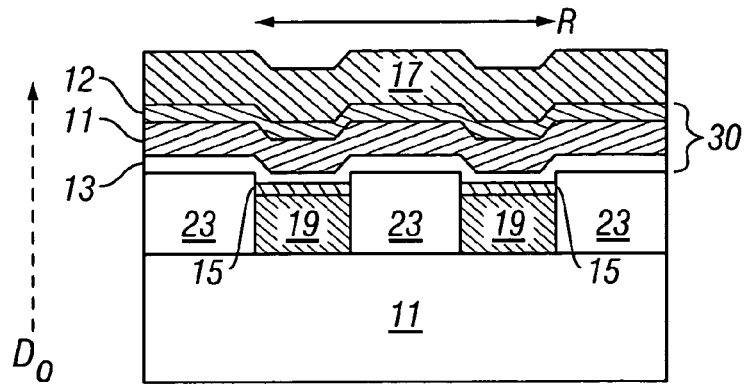
FIGS. 9a and 9b are a cross-sectional view and a profile view respectively of a plurality of layers of material and a second conductive layer deposited over a sense layer.
Figure 9B:
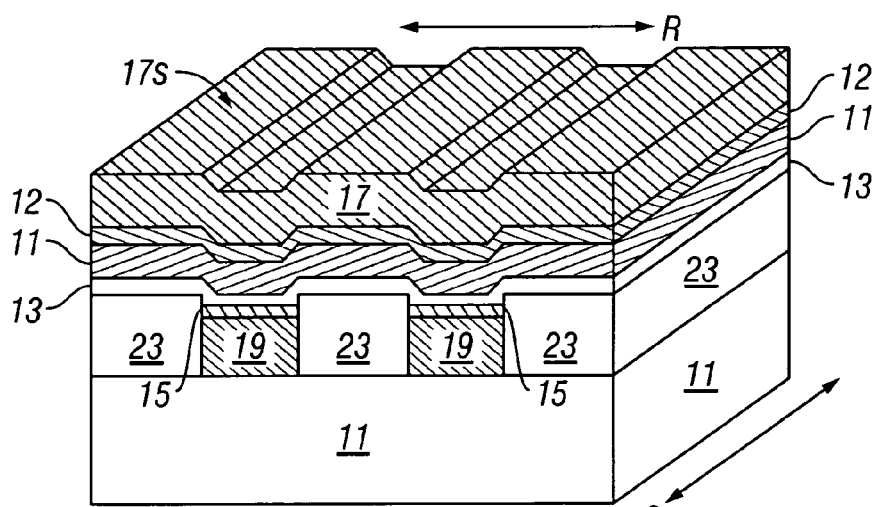

In FIGS. 9a and 9b, at a stage 87, a plurality of layers of material 30 are deposited in a deposition order $D_O$ over the sense layer 15 such that a bottom layer (e.g. a layer 13) of the plurality of layers of material 30 is in contact with the surface 15s of the sense layer 15. The plurality of layers of material 30 and the sense layer 15 form a magnetic tunnel junction stack. One of ordinary skill in the MRAM art will appreciate that a complete magnetic tunnel junction device will also include electrodes in electrical communication with the sense layer 15 and in electrical communication with a reference layer. The bottom electrode 19 will serve as one of those electrodes and a top electrode to be described below will serve as the other electrode.

Optionally, in FIG. 7, after the stage 85 and prior to the stage 87 where the plurality of layers of material 30 are deposited in the deposition order $D_O$, it may be desirable to clean the surface 15s of the sense layer 15. A surface cleaning of the surface 15s can be accomplished using a process including but not limited to an ion etching process and a sputtering process. Surface cleaning may be necessary to remove oxidation or contamination from the surface 15s of the sense layer 15. Contamination and oxidation can occur when a vacuum is broken between process steps and the sense layer 15 is exposed to an atmosphere that can contaminate or oxidize the sense layer 15.

The aforementioned deposition order $D_O$ will be determined by a topology of a specific type of magnetic tunnel junction device. Accordingly, although only three layers of material (13, 11, and 12) are depicted in the plurality of layers of material 30, the actual number of layers will be application specific and there can be more layers or fewer layers than the three layers depicted in FIGS. 9a and 9b.

As an example of one topology, the layer 13 can be a tunnel barrier layer for a spin tunneling magnetoresistance device and can be made from a thin layer of material such as an aluminum oxide ($Al_2O_3$) for a TMR device or copper (Cu) for a GMR device. The layer 11 can be a reference layer that includes a pinned orientation of magnetization and can be made from a thin layer of a ferromagnetic material. Examples of ferromagnetic materials for the layer 11 include but are not limited to nickel (Ni), iron (Fe), cobalt (Co), ruthenium (Ru), iridium (Ir), manganese (Mn), and alloys of those materials. As an example, the layer 11 can be made from nickel iron (NiFe), cobalt iron (CoFe), or a sandwich of layers of material such as CoFe—Ru—CoFe—IrMn, for example. The sense layer 15 can also be made from materials including but not limited to the above mentioned ferromagnetic materials for the layer 11. The layer 12 can be a cap layer made from a material such as tantalum (Ta), for example.

Although not shown, the topology of the magnetic tunnel junction device can include a layer of an anti-ferromagnetic material (AFM) that is deposited in the deposition order $D_O$. The AFM layer can be positioned between the layer 12 and the layer 11. Materials for the AFM layer include but are not limited to manganese (Mn), iron (Fe), iridium (Ir), platinum (Pt), and alloys of those materials. In the topology described above, in the deposition order $D_O$, the layer 13 (i.e. the bottom layer) is first deposited on the surface 15s of the sense layer 15, then the layer 11 is deposited on the layer 13, and finally the layer 12 (i.e. the top layer) is deposited on the layer 11. Optionally, an AFM layer can be deposited on the layer 11 followed by depositing the layer 12.

In FIGS. 9a and 9b, at a stage 89, a second conductive layer 17 is deposited on a top layer of the plurality of layers of material 30 (e.g. the layer 12). The second conductive layer 17 can be made from a material including but not limited to a metal, tungsten (W), copper (Cu), and aluminum (Al) and the second conductive layer 17 can be deposited by a process including but not limited to chemical vapor deposition (CVD), physical vapor deposition (PVD), plasma enhanced chemical vapor deposition (PECVD), and sputtering. As will be described below, the second conductive layer 17 will be patterned to form a top electrode.

Figure 9C:
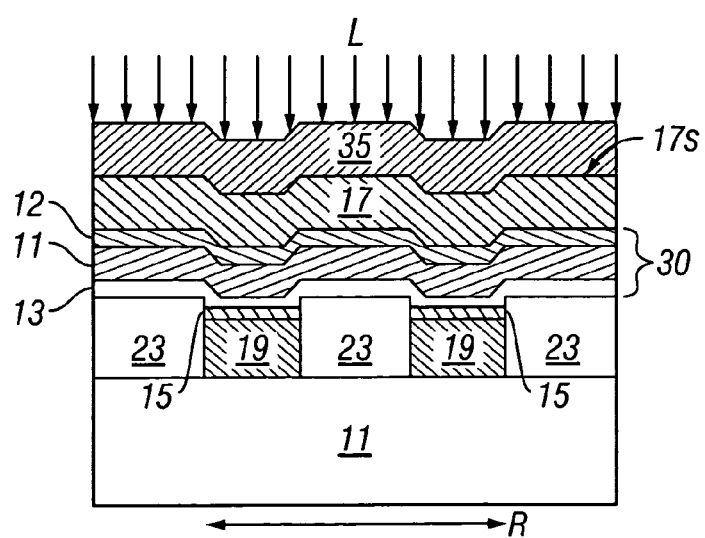
FIGS. 9c and 9d are a cross-sectional view and a top plan view respectively of a patterning of a second conductive layer.
Figure 9D:
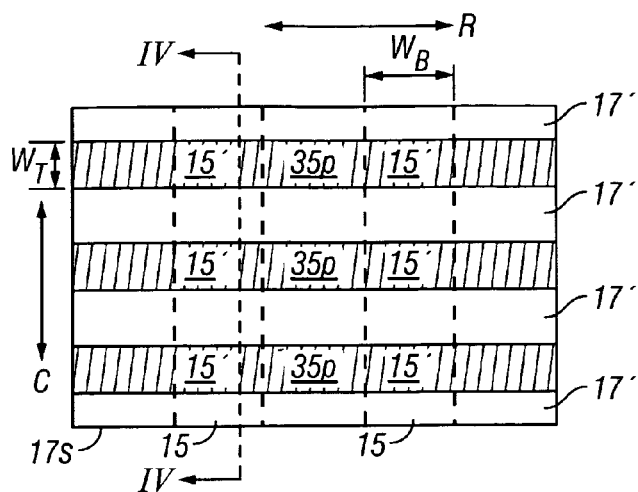

In FIGS. 9c and 9d, at a stage 91, the second conductive layer 17 is patterned in a second mask step as denoted by the dashed lines at the stage 91 in FIG. 7. As was described above, photolithographic processes that are well known in the microelectronics art can be used to pattern the second conductive layer 17. In FIG. 9c, a layer of photoresist material 35 is deposited on the second conductive layer 17 and is then exposed to a light L through a photo mask (not shown) to form a pattern for an etch mask in the photoresist material 35. In FIG. 9d, the photoresist material 35 is developed to form an etch mask 35p on the second conductive layer 17.

The etch mask 35p does not cover some portions 17' of the second conductive layer 17 as depicted in the top plan view of FIG. 9d. Accordingly, those portions that are not covered by the etch mask 35p will be etched away in a subsequent etching process. The sense layer 15 which is aligned with the first direction C and is positioned below the second conductive layer 17 and the plurality of layers of material 30, is depicted in heavy dashed line. Those portions of the sense layer 15 that cross under the etch mask 35p are denoted as 15' and will not be etched away during the aforementioned etching process so that the sense layer 15 will no longer be continuous in the first direction C and the portions 15' will form discrete sense layers.

In contrast, after the etching process, the plurality of layers of material 30 that are not covered by the etch mask 35p will be etched away. However, those portions of the plurality of layers of material 30 that are covered by the etch mask 35p will not be etched away and will be continuous in a second direction R.

Figure 9E:
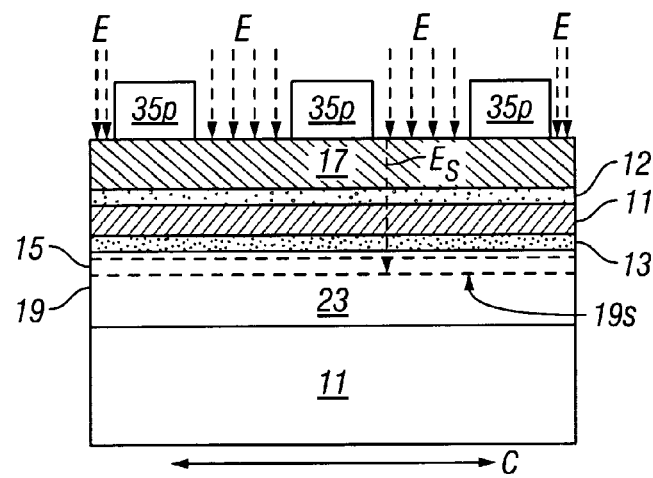
FIG. 9e is a cross-sectional view taken along a line of IV—IV off the top plan view of FIG. 9d and depicts an etch mask and an etching of a second conductive layer.
Figure 9F:
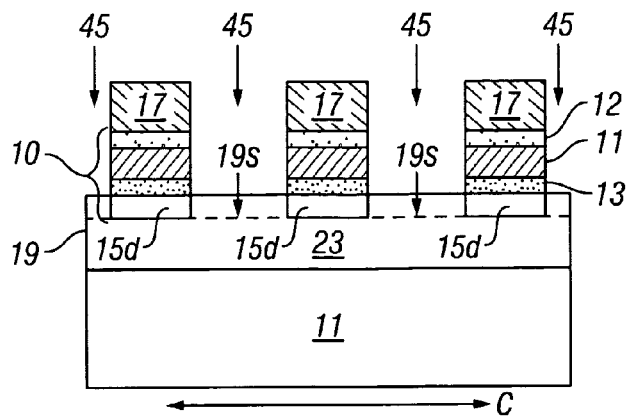
FIG. 9f is a cross-sectional view depicting a discrete magnetic tunnel junction stack.

In FIGS. 9e and 9f, at a stage 93, the second conductive layer 17, the plurality of layers of material 30, and the sense layer 15 are etched E. The etching E is continued all to way down to the surface 19s of the bottom electrode 19 as depicted by the dashed line $E_S$. In FIG. 9f, the etching E forms a top electrode 17 and a plurality of discrete sense layers 15d. Preferably, an anisotropic etching process, such as RIE for example, is used for the etching E. The plurality of layers of material 30 and the discrete sense layers 15d define a plurality of discrete magnetic tunnel junction devices 10. Each of the magnetic tunnel junction devices 10 includes the discrete sense layer 15d in electrical communication with the bottom electrode 19 and a reference layer 11 in electrical communication with the top electrode 17.

After the etching E, the bottom electrode 19 is continuous in the first direction C. The top electrode 17 and the plurality of layers of material 30 are continuous with each other in the second direction R. Accordingly, each magnetic tunnel junction device 10 includes a discrete sense layer 15d but the other layers in the plurality of layers of material 30 are continuous in the second direction R. In FIG. 9f, after the etching E, a space 45 between the top electrodes 17 and the discrete magnetic tunnel junction devices 10 can be filled in with a dielectric material (not shown) such as a silicon oxide ($SiO_2$), a silicon nitride ($Si_3N_4$), or a tetraethylorthosilicate (TEOS). The dielectric material can serve as a passivation that electrically isolates the discrete magnetic tunnel junction devices 10 and the top electrodes 17 from one another.

Figure 10A:
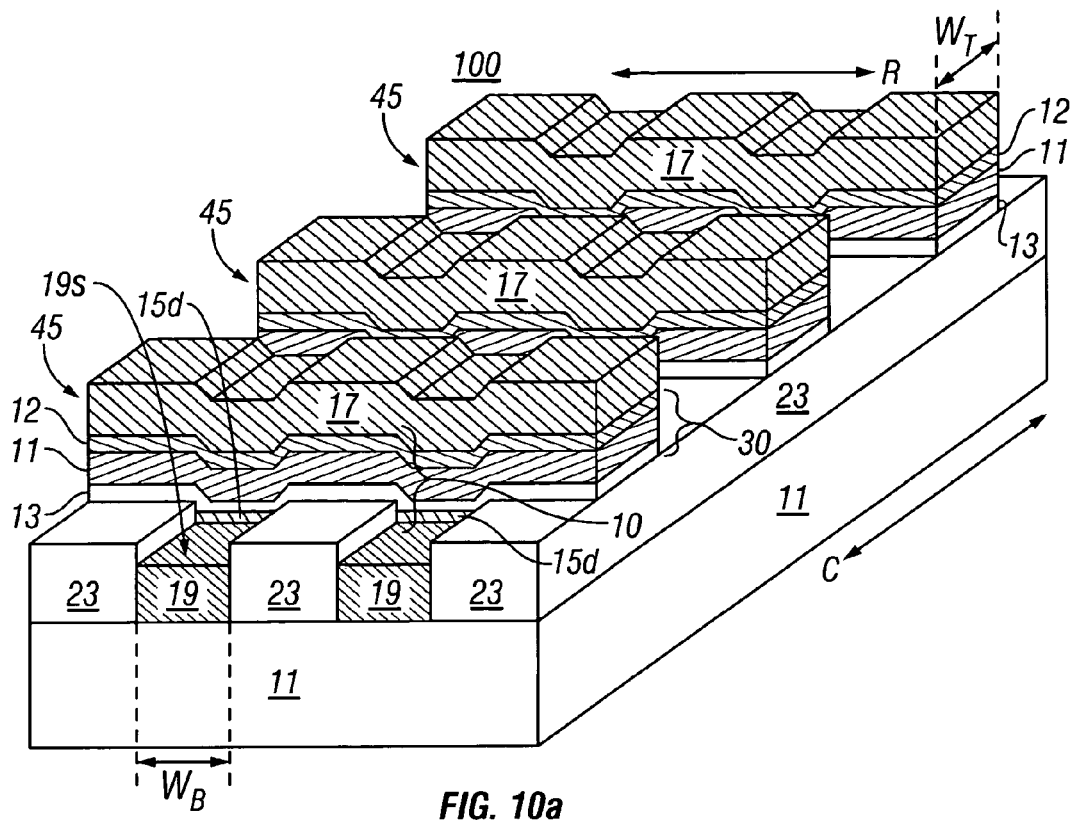
FIGS. 10a and 10b are a profile view and a top plan view respectively of a MRAM device.
Figure 10B:
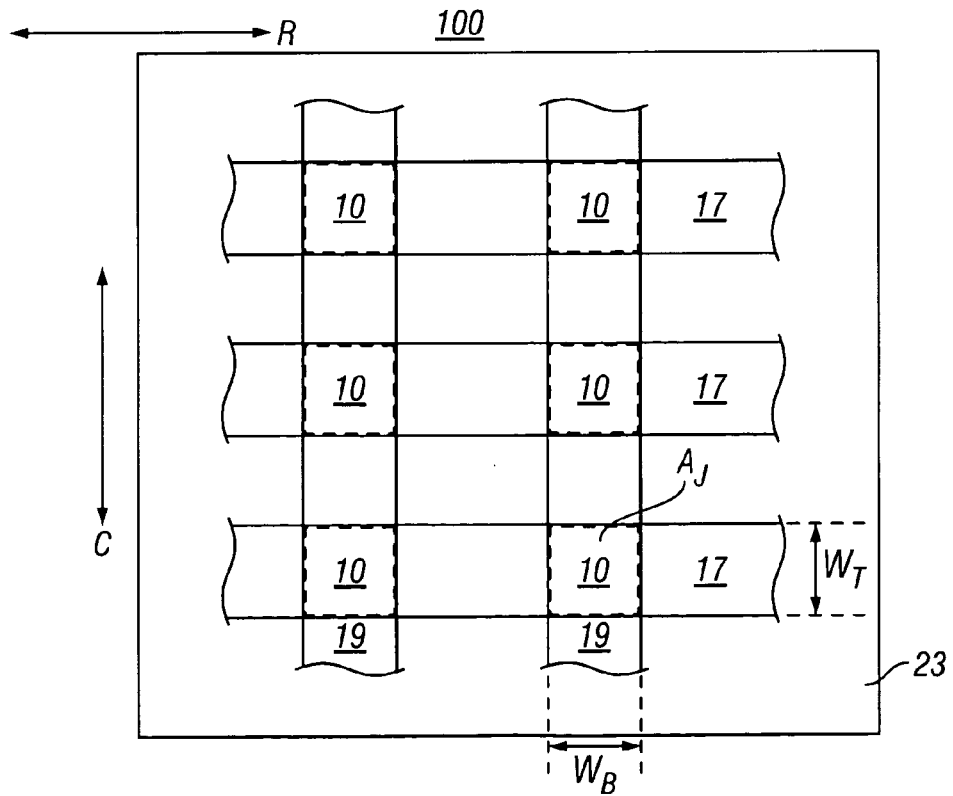

In FIGS. 10a and 10b, an MRAM device 100 can include the plurality magnetic tunnel junction devices 10 arranged in an array in which each magnetic tunnel junction devices 10 is positioned intermediate between an intersection of the top electrode 17 and the bottom electrode 19. The top electrodes 17 are substantially aligned with the second direction R and the bottom electrodes 19 are substantially aligned with the first direction C. The first direction C and the second direction R can be substantially orthogonal to each other as depicted in FIG. 10b. After the etching E at the stage 93, the top electrodes 17 have a width $W_T$. The bottom electrodes 19 have the width $W_B$ as described above. Because the discrete sense layers 15d have the width $W_B$, the discrete magnetic tunnel junction devices 10 have an area $A_J$ substantially determined by the width $W_T$ of the top electrode 17 and the width $W_B$ of the bottom electrode 19. That is: $(A_J \approx W_T * W_B)$. The top electrodes 17 can be row conductors that are substantially aligned with the second direction R and the bottom electrodes 19 can be column conductors that are substantially aligned with the first direction C. One of ordinary skill in the MRAM art will appreciate that top electrodes 17 can be column conductors and the bottom electrodes 19 can be row conductors.

Figure 7A:
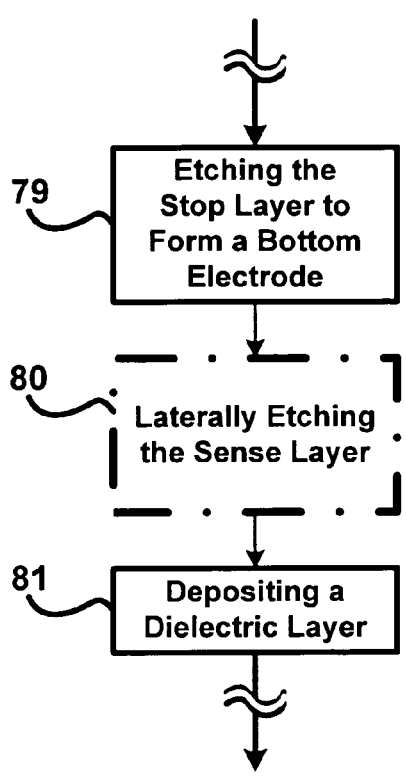
Figure 11A:
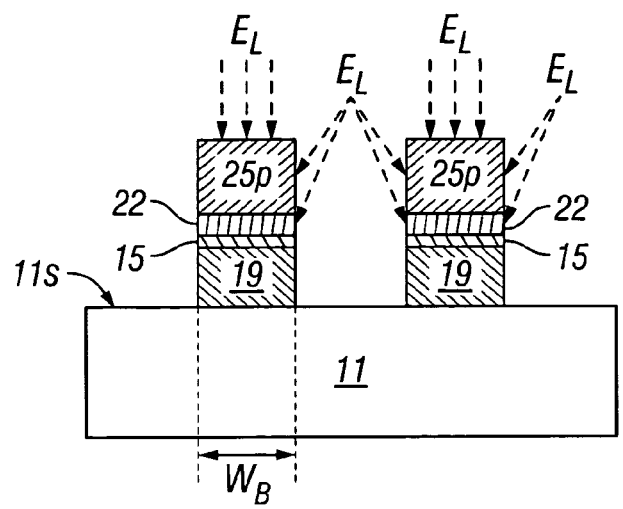
FIGS. 11a and 11b are cross-sectional views depicting a process for reducing a dimension of a sense layer.
Figure 11B:
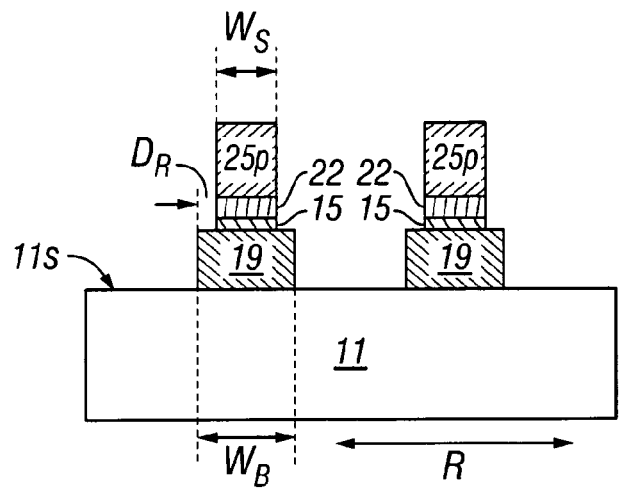

Optionally, it may be desirable to reduce the area $A_J$ by reducing a dimension of the sense layer 15, or a dimension of one or more of the layers in the plurality of layers of material 30. In FIG. 11a and referring to FIG. 7a, after the stage 79 and prior to the stage 81, the sense layer 15, the stop layer 22, and the mask layer 25p can be exposed to an etch material that is selective to those materials (15, 22, 25p) but not selective to a material for the bottom electrode 19. Accordingly, in FIG. 7a, at a stage 80 (shown in heavy dash-dot outline), an etch process is used to laterally etch $E_L$ the materials (15, 22, 25p).

Figure 11C:
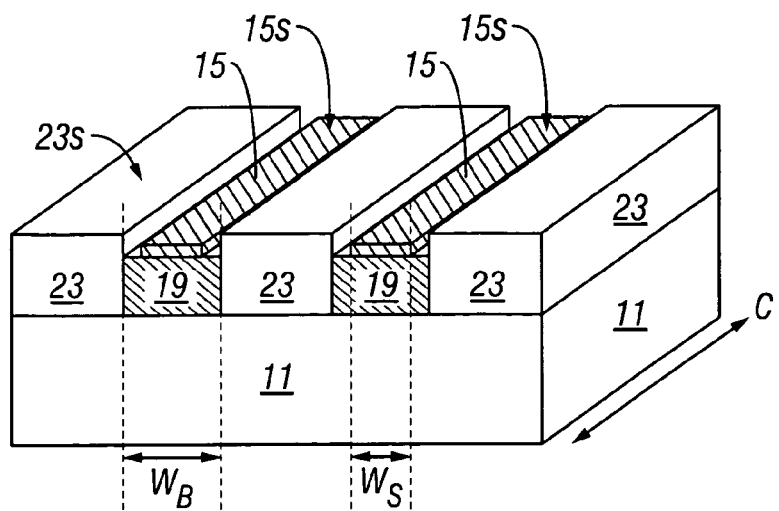
FIG. 11c is a profile view depicting a sense layer with a reduced width.

The etching $E_L$ is continued until the sense layer 15 has recessed by a predetermined distance $D_R$ from an edge of the bottom electrode 19. Consequently, in FIG. 11c, a width $W_S$ of the sense layer 15 is less than the width $W_B$ of the bottom electrode 19 (i.e. $W_S < W_B$). The width $W_S$ of the sense layer is reduced along the second direction R. An etching process such as RIE can be used to effectuate the lateral etching $E_L$.

Figure 7B:
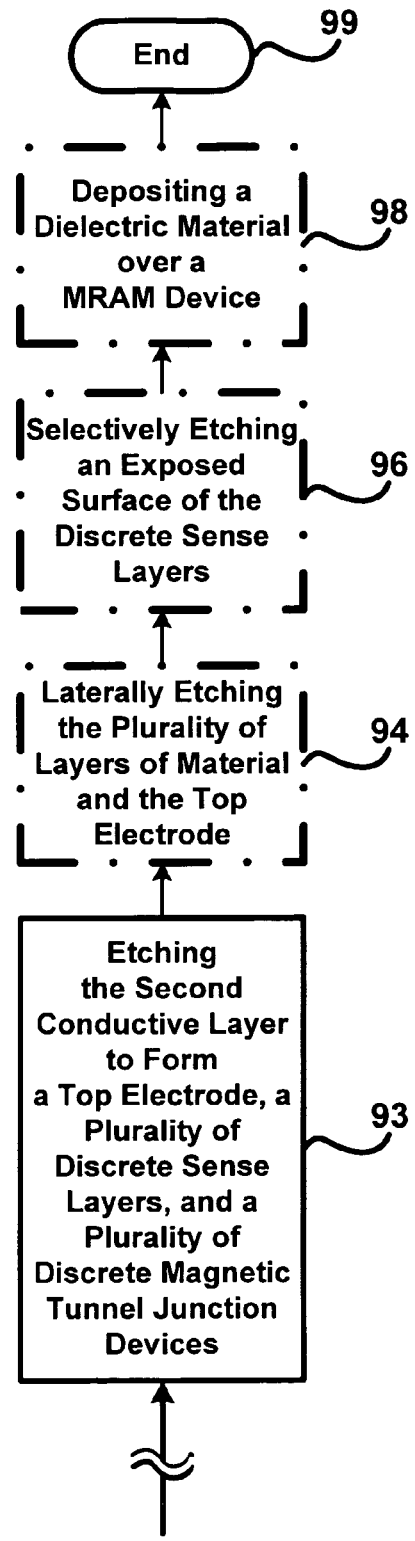
Figure 12A:
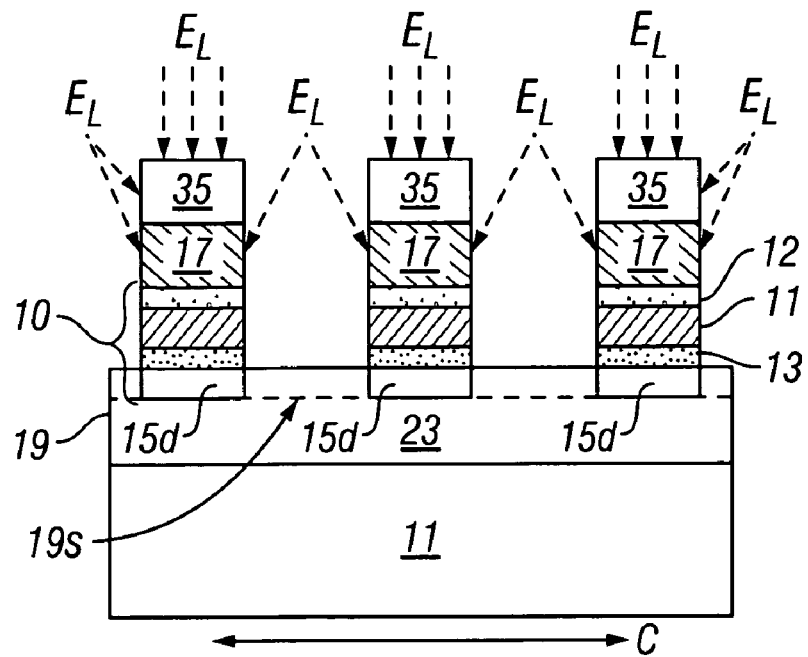
FIGS. 12 and 12b are cross-sectional views depicting a process for reducing a dimension of a top electrode and a plurality of layers of material.
Figure 12B:
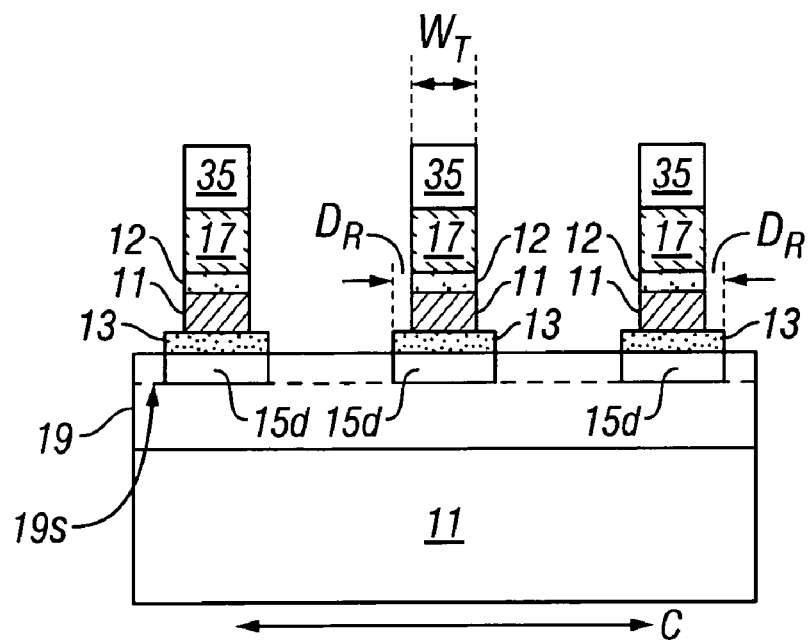

In FIGS. 12a and 12b and referring to FIG. 7b, after the stage 93, at a stage 94 (shown in heavy dash-dot outline) a similar lateral etching process $E_L$ (e.g. using RIE) can be applied to the top electrode 17 and the plurality of layers of material 30. In FIG. 12a, the etch mask 35, the top electrode 17, the cap layer 12, and the reference layer 11 are laterally etched $E_L$ until the those layers have recessed by a predetermined distance $D_R$ from an edge of the discrete sense layer 15d as depicted in FIG. 12b. The predetermined distance $D_R$ can also be referenced from the tunnel barrier layer 13. Although not shown in FIG. 12b, an etch material for the lateral etching process $E_L$ can be selected to etch the tunnel barrier layer 13 as well as the other layers (35, 17, 12, and 11). Consequently, in FIG. 12b, a width $W_T$ of the top electrode 17 and of the reference layer 11 is reduced when compared to a width $W_T$ of the top electrode 17 and the plurality of layers of material 30 as depicted in FIGS. 9d, 10a, and 10b.

Figure 13A:
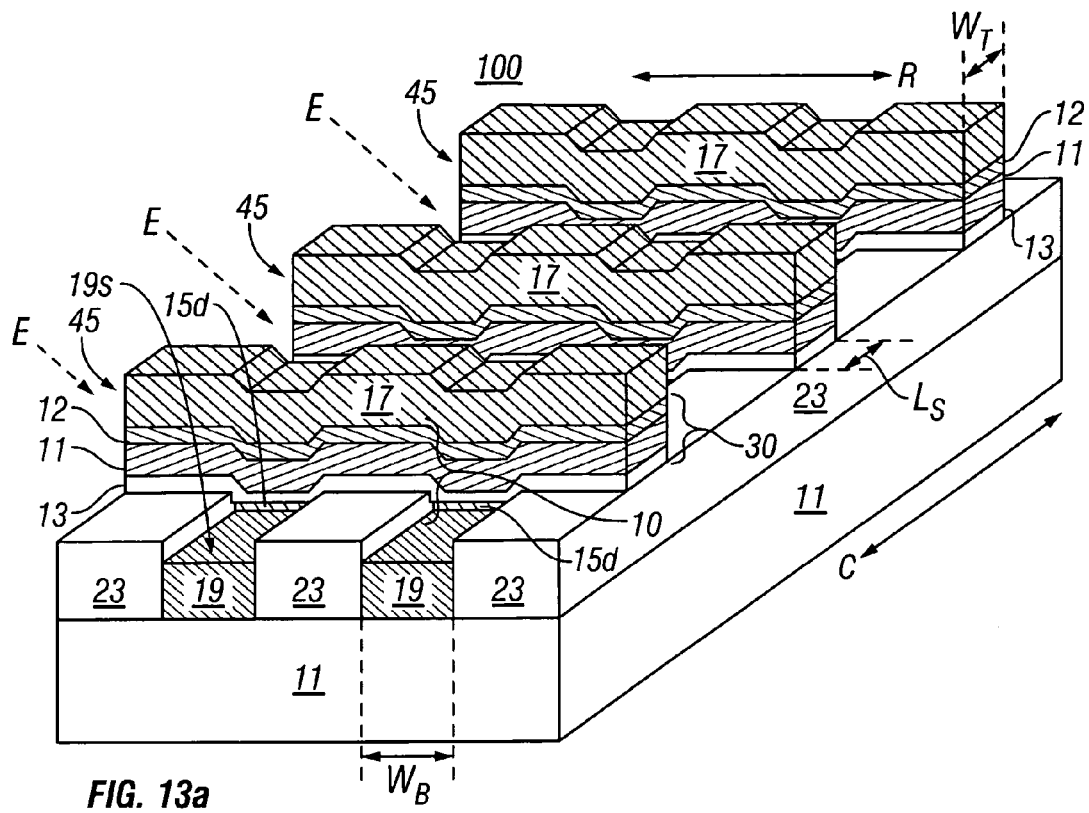
FIGS. 13a and 13b are a profile view and a top plan view respectively of a MRAM device.

In FIG. 13a and referring to FIG. 7b, a further reduction in the area $A_J$ can be accomplished at a stage 96 (shown in heavy dash-dot outline) by applying a highly selective etch E to the exposed surfaces of the discrete sense layers 15d such that the exposed surfaces are laterally etched and recede under the tunnel barrier layer 13. Consequently, after the etching E, a length $L_S$ of the discrete sense layers 15d is reduced along the first direction C.

Figure 13B:
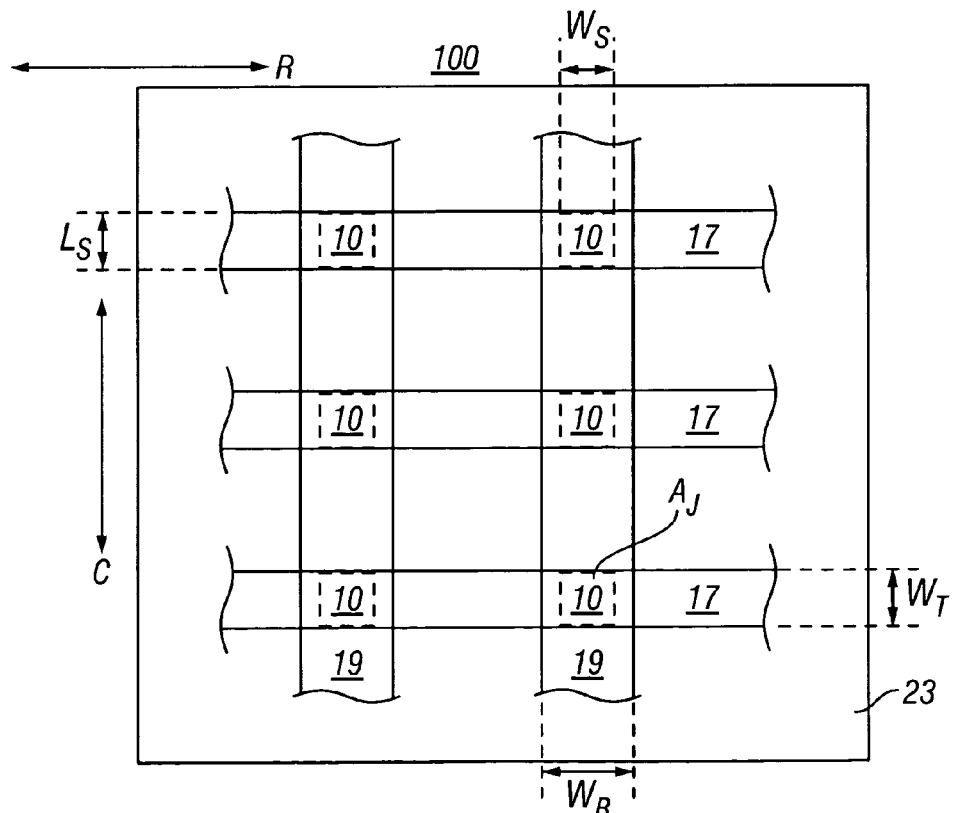

Accordingly, an area of discrete sense layers 15d can be reduced by reducing the width to $W_S$ as described above, reducing the length $L_S$, or by both reducing the width to $W_S$ and the length to $L_S$. In FIG. 13b, by reducing the width $W_T$ of the top electrode 17 as described above and by reducing the width and length of the discrete sense layers 15d to $W_S$ and $L_S$, the area $A_J$ of the magnetic tunnel junction devices 10 can be reduced to an area smaller than the area $A_J$ as depicted in FIG. 10b. Preferably a wet etch process that is not selective to the materials of the top electrode 17 and the materials in the plurality of layers of material 30 is used to selectively etch E the discrete sense layers 15d.

In FIGS. 10a and 13a and referring to FIG. 7b, one of ordinary skill in the art will appreciate that a dielectric material (not shown) can be deposited over the MRAM device 100 to fill in a space 45 between the top electrodes 17 and the plurality of layers of material 30, to electrically isolate the electrodes (17, 19) and the magnetic tunnel junction devices 10 in adjacent rows and columns from one another, and to generally provide a layer of passivation for the MRAM device 100. Accordingly, at a stage 98, a dielectric material is deposited over the MRAM device 100 to fill in the spaces 45 and any other voids in the structure depicted in FIGS. 10a and 13a. The dielectric material can include but is not limited to a silicon oxide ($SiO_2$), a silicon nitride ($Si_3N_4$), and a tetraethylorthosilicate (TEOS). If the top and bottom electrodes (17, 19) are completely covered by the dielectric material, then subsequent patterning and etching steps can be used to form vias (not shown) in the dielectric layer that extend down to the to the top and bottom electrodes (17, 19).

The formation of the vias can be followed by a deposition of an electrically conductive material to facilitate an electrical connection with the electrodes (17, 19). The dielectric material can be planarized after the deposition in order to form a substantially planar surface for subsequent processing steps. For example, after fabricating the MRAM device 100 as described above, another layer of the MRAM device 100 can be fabricated over the previously MRAM device 100 to form a multi-level MRAM device. The planarized surface can serve as the substrate 11 upon which to deposit the first conductive layer followed by a deposition of the sense layer 15 as was described above in reference to FIGS. 7 through 10b.

Optionally, to reduce the number of processing stages depicted in FIG. 7 while still using only two patterning steps, the stages 75, 77, 79, and 85 for processing of the stop layer 22 can eliminated. Instead, after the depositing of the sense layer 15 on the first conductive layer 19 at the stage 73, the sense layer 15 can be patterned (i.e. the first patterning step) and then etched E to form a bottom electrode 19 and a sense layer 15 that are continuous with each other in the first direction C (i.e. FIG. 8c minus the stop layer 22).

Subsequently, the dielectric layer 23 can be deposited over the sense layer 15 and bottom electrode 19, followed by planarizing the dielectric layer 23 to form a substantially planar surface 23s. The substantially planar surface 23s can be substantially flush with the surface 15s of the sense layers 15 or the surface 15s of the sense layer 15 can be slightly recessed below the substantially planar surface 23s as depicted in FIGS. 8f and 8g. Subsequently, the stages 87 through 93 of FIG. 7 and optionally stages 80, 94, 96, and 98 of FIGS. 7a and 7b, can be executed. As described above, it may be desirable to surface clean the sense layer 15.

Although several embodiments of the present invention have been disclosed and illustrated, the invention is not limited to the specific forms or arrangements of parts so described and illustrated. The invention is only limited by the claims.

What is claimed is:

1. A method of fabricating a MRAM device, comprising:
   depositing a first conductive layer on a substrate;
   depositing a sense layer on the first conductive layer;
   depositing a stop layer on the sense layer;
   patterning the stop layer;

etching the stop layer, the sense layer, and the first conductive layer to form a bottom electrode with the sense layer continuous with the bottom electrode in a first direction;

depositing a dielectric layer;

planarizing the dielectric layer;

removing the stop layer to expose a surface of the sense layer;

depositing a plurality of layers of material over the sense layer to form a magnetic tunnel junction stack;

depositing a second conductive layer on a top layer of the plurality of layers of material;

patterning the second conductive layer; and etching the second conductive layer, the plurality of layers of material, and the sense layer to form a top electrode and a plurality of discrete sense layers, the plurality of layers of material and the plurality of discrete sense layers define a plurality of discrete magnetic tunnel junction devices, and the top electrode and the plurality of layers of material are continuous with each other in a second direction.

2. The method as set forth in claim 1, wherein the planarizing the dielectric layer comprises a chemical mechanical planarization process.

3. The method as set forth in claim 1, wherein the stop layer comprises a chemical mechanical planarization stop layer.

4. The method as set forth in claim 3, wherein the planarizing the dielectric layer comprises a chemical mechanical planarization process.

5. The method as set forth in claim 1, wherein the plurality of layers of material are deposited over the sense layer in a deposition order and the deposition order is determined by a topology for the plurality of magnetic tunnel junction devices.

6. The method as set forth in claim 1, wherein the etching the stop layer, the sense layer, and the first conductive layer comprises an anisotropic etch process.

7. The method as set forth in claim 1, wherein the etching the second conductive layer, the plurality of layers of material, and the sense layer comprises an anisotropic etch process.

8. The method as set forth in claim 1 and further comprising after the etching of the stop layer:

laterally etching the stop layer and the sense layer until the stop layer and the sense layer recede a predetermined distance from an edge of the bottom electrode and the sense layer has a width that is less than a width of the bottom electrode.

9. The method as set forth in claim 1 and further comprising after the etching of the second conductive layer:

laterally etching the top electrode and the plurality of layers of material until the top electrode and the plurality of layers of material have recessed a predetermined distance from an edge of the discrete sense layer.

10. The method as set forth in claim 1 and further comprising after the etching of the second conductive layer:

selectively etching the discrete sense layer so that an exposed surface of the discrete sense layer is laterally etched and a length of the discrete sense layer is reduced along the first direction.

11. The method as set forth in claim 10, wherein the selective etching comprises a wet etch process.

12. The method as set forth in claim 1 and further comprising:

depositing a dielectric material to fill in a space between the top electrodes and the plurality of layers of material.

13. The method as set forth in claim 1 and further comprising after the removing the stop layer:

cleaning the surface of the sense layer.

14. A MRAM device fabricated according to the method as set forth in claim 1.

* * * * *